US012794216B1

(12) United States Patent
Lewis et al.

(10) Patent No.: US 12,794,216 B1
(45) Date of Patent: Nov. 10, 2026

(54) MODULAR POWER SURGE PROTECTION AND POWER FACTOR CORRECTION

(71) Applicant: Speed Joule LLC, Alamogordo, NM (US)

(72) Inventors: Joseph Lewis, Alamogordo, NM (US); Deborah Bee, Alamogordo, NM (US)

(73) Assignee: Speed Joule LLC, Alamogordo, NM (US)

( * ) Notice: Subject to any disclaimer, the term of this patent is extended or adjusted under 35 U.S.C. 154(b) by 226 days.

(21) Appl. No.: 18/886,965

(22) Filed: Sep. 16, 2024

Related U.S. Application Data

(60) Provisional application No. 63/538,661, filed on Sep. 15, 2023.

(51) Int. Cl.

| | |
|---|---|
| ***H02H 3/00*** | (2006.01) |
| ***H02H 3/20*** | (2006.01) |
| ***H05K 1/02*** | (2006.01) |
| ***H05K 1/11*** | (2006.01) |
| ***H05K 1/181*** | (2026.01) |

(52) U.S. Cl.
CPC ............. *H02H 3/20* (2013.01); *H05K 1/0286* (2013.01); *H05K 1/111* (2013.01); *H05K 1/181* (2013.01)

(58) Field of Classification Search
CPC ....................................................... H02H 3/20
See application file for complete search history.

(56) References Cited

U.S. PATENT DOCUMENTS

| | | | | | |
|---|---|---|---|---|---|
| 5,625,521 | A * | 4/1997 | Luu | H02H 9/042 361/111 |
| 7,324,005 | B2 * | 1/2008 | Stoof | H01R 13/6666 340/638 |
| 12,301,100 | B2 * | 5/2025 | Chin | H02M 1/32 |
| 2006/0007625 | A1 * | 1/2006 | Harford | H02H 9/005 361/118 |
| 2006/0056127 | A1 * | 3/2006 | Lewis | H02H 9/005 361/118 |
| 2013/0257390 | A1 * | 10/2013 | Jin | H02M 1/4233 323/205 |
| 2015/0138856 | A1 * | 5/2015 | Huynh | H02M 1/4225 363/84 |
| 2015/0270057 | A1 * | 9/2015 | Lestician | H01F 27/2823 323/361 |

* cited by examiner

*Primary Examiner* — Stephen W Jackson
(74) *Attorney, Agent, or Firm* — Peacock Law P.C.; Justin R. Jackson; Justin R. Muehlmeyer

(57) ABSTRACT

A surge protection and power factor correction circuit that can be constructed on a modular circuit board. The printed circuit board can have a one or more weakened areas that enable a user of the PCB, which can include a manufacturer, to physically separate portions of the board at one or more break locations so that places for connection of additional power factor correction capacitors can be removed from the circuit, thus providing a single circuit board that can be adjusted to a desirable circuit configuration.

9 Claims, 6 Drawing Sheets

MODULAR POWER SURGE PROTECTION AND POWER FACTOR CORRECTION

CROSS-REFERENCE TO RELATED APPLICATIONS

This application claims priority to and the benefit of the filing of U.S. Provisional Patent Application No. 63/538,661, entitled "Modular Power Surge Protection and Power Factor Correction", filed on Sep. 15, 2023, and the specification thereof is incorporated herein by reference.

BACKGROUND OF THE INVENTION

Embodiments of the present invention relate to a method and apparatus, most preferably including a circuit on a printed circuit board ("PCB"), that provides modular power factor correction and surge protection. More particularly, a circuit on a circuit board which has physically weakened areas that provide a location which enables a user, which can include for example a manufacturer, to snap the circuit board to remove portions of the circuit in order to provide the ability for the user to selectively adjust the PCB to accommodate a number of power factor correction capacitors for the resulting circuit. This provides the ability for a batch of circuit boards to be constructed, all identical to one another yet provide the ability for various circuits to be constructed in order to provide greater manufacturing flexibility from a single original PCB.

Poor power factor and voltage transients, for example those caused by harmonic distortion, can cause motors to run hot and can increase apparent power beyond the working power, thus decreasing efficiency of the system. Embodiments of the present invention can assist in correcting the power factor and in filtering and thereby removing the transients, thus, allowing loads—for example appliances and motors, to run cooler, which provides a longer life of such equipment and improves the efficiency of the overall system. Embodiments of the present invention can also provide for a "soft start" of motors. Another benefit is that the circuit of embodiments of the present invention is removable, compact and durable and various resulting circuits can optionally be produced from a single PCB by cutting or snapping it to a desired length.

BRIEF SUMMARY OF EMBODIMENTS OF THE PRESENT INVENTION

Embodiments of the present invention relate to a modular surge and power factor correction printed circuit board ("PCB") that can include input pads coupled to a plurality of traces on a first end portion of the PCB, one or more break locations formed across the PCB, the one or more break locations defined at least partially by a corresponding one or more weakened areas of the PCB, the input pads disposed on a first side of the one or more break locations; and at least two component connection pads disposed on a second side of each of the break locations. A plurality of component placement pads can be disposed on the first side of the one or more break locations. The one or more break locations can include at least two break locations, and the PCB can include traces and component pads disposed on a portion of the PCB that resides between a first break location and a second break location which traces, and component pads are schematically equivalent to traces and component pads disposed on a portion of the PCB that resides on the second side of a second break location. The one or more weakened areas can include at least three weakened areas, and the PCB can include traces and component pads disposed on a second side of a third break location which are schematically equivalent to traces and component pads disposed on a portion of the PCB that resides on the second side of a second break location.

Embodiments of the present invention also relate to a surge protection and power factor correction apparatus including an electrical circuit, the electrical circuit including a ground or neutral line connection, a first non-grounded line connection, a second non-grounded line connection, at least two thermal cutoffs, each of the at least two thermal cutoffs electrically coupled to a respective one of the first and the second non-grounded line connections, a plurality of surge clamps, at least a first of the plurality of surge clamps coupled between the first non-grounded line connection and the second non-grounded line, a first power factor correction capacitor coupled between the first non-grounded line connection and the second non-grounded line connection, and wherein at least one of the plurality of surge clamps is disposed less than 8 millimeters from each of the at least two thermal cutoffs.

The plurality of surge clamps can include a third surge clamp coupled between the first non-grounded line connection and the ground or neutral line connection and a fourth surge clamp coupled between the second non-grounded line connection and the ground or neutral line connection.

In one embodiment, a third surge clamp can be provided, which can be coupled in parallel with the first power factor correction capacitor. Optionally, at least one of the surge clamps can include one or a combination of: a metal oxide varistor, an avalanche diode, and/or a tunnel diode. At least one of the plurality of surge clamps can be disposed less than 5 millimeters from each of the at least two thermal cutoffs, less than 2 millimeters from each of the at least two thermal cutoffs, and/or can be in physical contact with each of the at least two thermal cutoffs.

The electrical circuit can be at least partially encased within a potting material. The potting material comprises sand. The surge protection and power factor correction apparatus can further include two filter capacitors, each of the at least two filter capacitors coupled between a respective one of the first non-grounded line connection and the second non-grounded line connection and the ground or neutral line connection.

Optionally, a third non-grounded line connection can be provided. The plurality of surge clamps can also include a third surge clamp coupled between the second non-grounded line connection and the third non-grounded line connection, a fourth surge clamp coupled between the first non-grounded line connection and the third non-grounded line connection, and a fifth surge clamp coupled between the third non-grounded line connection and the ground or neutral line connection.

The surge protection and power factor correction apparatus can also include a second power factor correction capacitor coupled between the third non-grounded line connection and the first non-grounded line connection and a third power factor correction capacitor coupled between the third non-grounded line connection and the second non-grounded line connection.

Embodiments of the present invention also relate to a method for manufacturing a modular power surge and power factor correction apparatus that includes providing printed circuit board ("PCB") having at least one weakened area; choosing not to not break the PCB along the at least one weakened area if separating the board along the weakened area would result in an insufficient number of power factor connection pads on the resulting board for a desired power factor correction value to be achieved in a circuit constructed thereon; choosing to break the PCB along the at least one weakened area if separating the board along the weakened area would not result in an insufficient number of power factor connection pads on the resulting board for a desired power factor correction value to be achieved in a circuit constructed thereon; and separating or not separating the PCB along the at least one weakened area as determined in the two choosing steps.

In the method, the step of providing a PCB can include providing a PCB having at least two weakened areas. The method can also include constructing a power surge and power factor correction circuit on a remaining portion of the PCB after the step of separating or not separating the PCB along the at least one weakened area.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1:
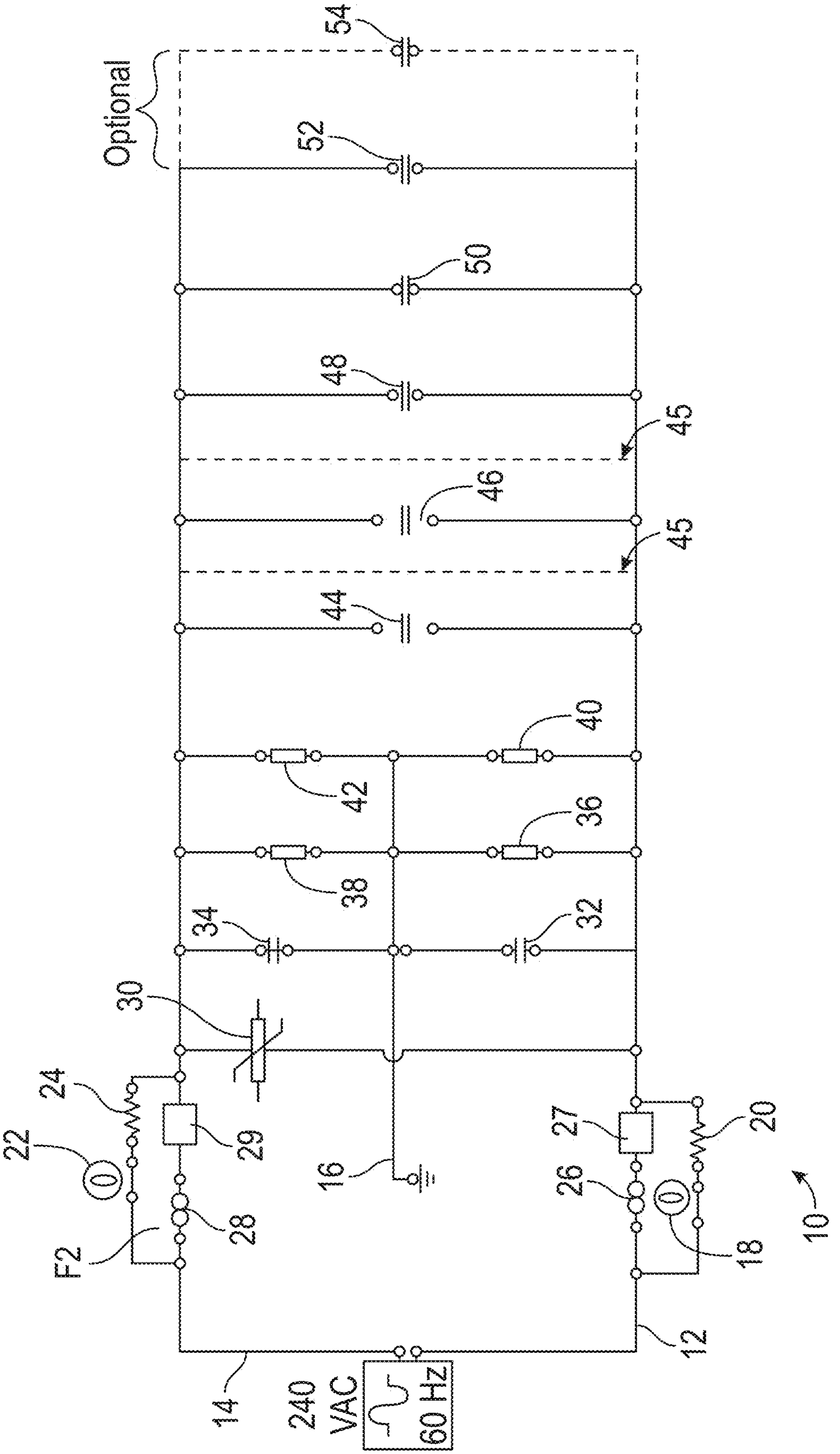
FIG. 1 is a circuit diagram which illustrates an embodiment of an adjustable power factor correction circuit that can be provided from a single PCB according to an embodiment of the present invention with an optional capacitor.

Referring now to the drawings, FIG. 1 illustrates a circuit diagram for a power factor correction circuit 10 according to an embodiment of the present invention. In power factor correction circuit 10, split phase line input voltages are preferably input at first power line 12 and second power line 14. Ground line 16 is preferably connected to an earth-grounded line or connection point, which can optionally include for example connection to a neutral conductor line and/or a ground line. One or more indicators 18 and 22 can optionally be provided on one or both of the power lines, a corresponding resistor 20 and/or 24 can be connected thereto. One or both of the power lines 12 and 14 can have fuse 26 and/or 28. Optionally, thermal cutoff 27 and/or 29 can be provided to stop the flow of electricity in the event that a predetermined maximum temperature is reached or exceeded. Optionally, the thermal cutoffs 27 and/or 29 can be resettable and are most preferably disposed such that each is in series with a respective one of fuse 26 or 28. In one embodiment, indicators 18 and 22, and their respective resistors 24 and 27 can optionally be connected in parallel across the fuse and thermal cutoff that are on their respective power lines such that if the thermal cutoff or fuse trips, the indicator will thus be activated.

Most preferably, after the fuse and thermal reset, a surge clamp 30 is preferably provided to connect power lines 12 and 14 together. The terms “surge clamp” and “surge clamps” are intended to include any transient clamping components, including but not limited to metal oxide varistors, tunnel diodes, avalanche diodes, combinations thereof and the like.

A pair of capacitors 32 and 34 are used to tie each of the first and second power lines to ground to allow any high frequency transient signals, noise, and/or higher frequency harmonics to be pulled to ground. In one embodiment, capacitors 32 and 34 preferably have a capacitance of about 1000 picofarad (“pF”) to about 0.5 microfarad (“uF”), and more preferably about 10,000 pF to about 0.05 uF, and most preferably about 10,000 pF.

Moving to the right in the circuit as illustrated in FIG. 1, a pair of surge clamps 36 and 38, and more preferably two pairs of surge clamps 36, 38, 40, and 42 are preferably provided between each respective power line and ground. First power factor correction capacitor 44 is preferably coupled between the power lines. Although the capacitance value of power factor correction capacitor 44 (and all other power factor correction capacitors used in the embodiments of the present invention) can optionally have any desired value that is believed or otherwise calculated to provide particularly desirable filtering effect or power factor correction for a given application, in one embodiment, power factor correction capacitor 44 preferably comprises a capacitance of about 0.5 to about 50 uF, more preferably about 1 to about 10 uF and most preferably about 6 uF.

Figure 2:
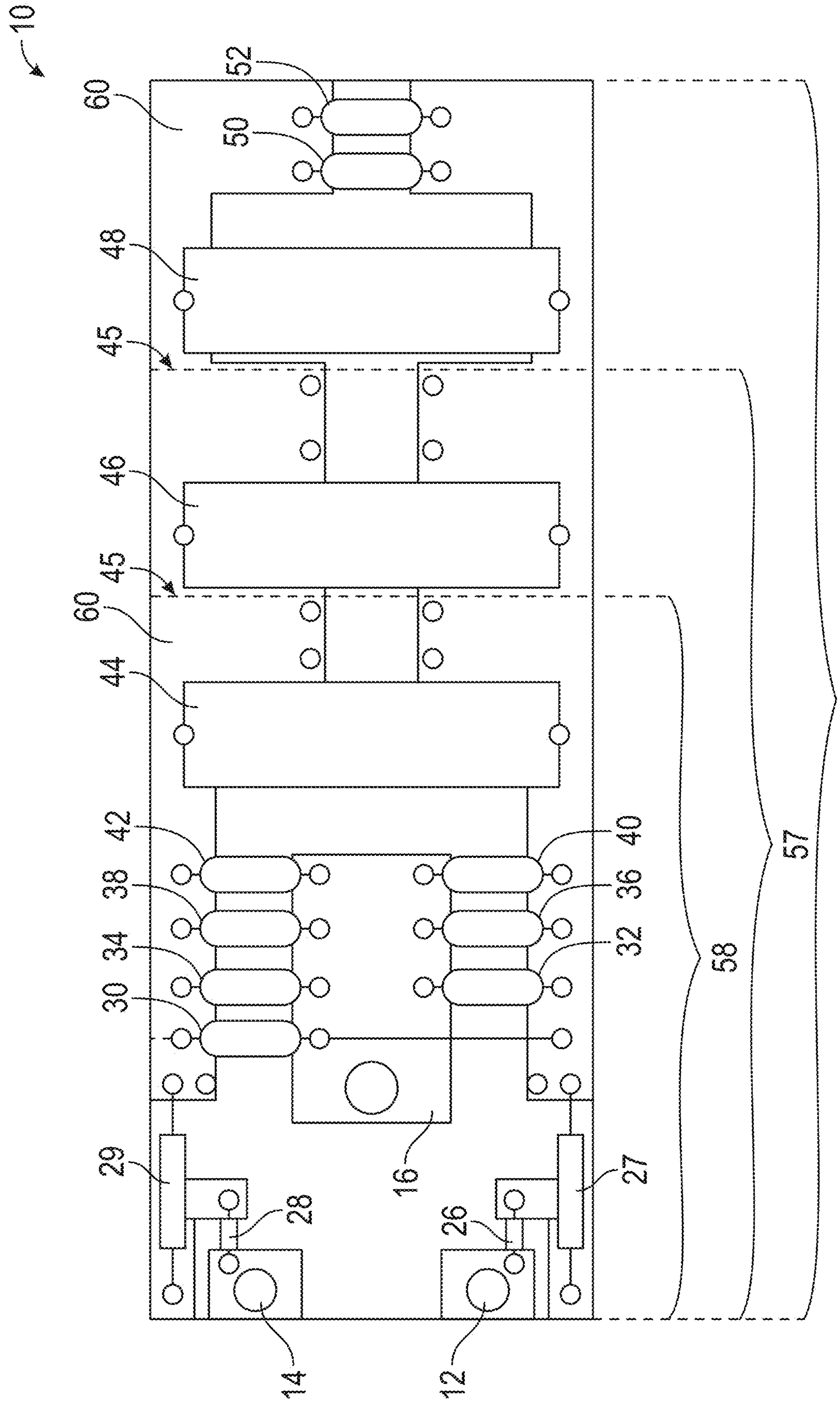
FIG. 2 is a drawing which illustrates a physical layout diagram of a circuit according to FIG. 1 without the optional capacitor being used.

As best illustrated in FIG. 2, printed circuit board (“PCB”) 60 preferably comprises one or more weakened areas 43 across a portion or section of PCB 60 such that PCB 60 can be snapped or otherwise broken along one or more break locations 45 to provide a user the ability to easily choose a final overall PCB configuration that best satisfies a desired application or desired power factor correction capacitance value. Weakened areas 43 can be formed via any desired method and can optionally comprise one or more scored lines within or on the substrate of PCB 60, one or more openings formed in or through PCB 60, a profile shape of PCB 60 that is narrowed to form one or more weakened areas 43 and/or a combination thereof.

As seen in FIG. 2, a left portion of the circuit of PCB 60 is preferably used regardless of the number of power factor correction capacitors that are used for given application. Accordingly, as can be seen, weakened areas 43 are preferably positioned after one or more of power factor correction capacitors (for example in FIG. 2, weakened areas 43 are physically positioned after each of power factor correction capacitors 44 and 46 (when considered as oriented from left to right in the example of FIG. 2). In the example of FIG. 2, this enables a user to choose to leave PCB 60 intact and not break it along either of break locations 45 such that the entirety of PCB 60 can be used when a maximum amount of reactive capacitance is desired, that can be provided by three power factor correction capacitors (44, 46, and 48)—this is illustrated as resulting board 56 in FIG. 2. Or, the user can instead choose to break PCB 60 at its rightmost break location 45 (for example by shearing it along weakened areas 43 or by bending it such that a central portion of the deflection occurs along the rightmost weakened area 45, thus snapping PCB 60 into two pieces along the rightmost break location 45). This will result in PCB 60, and thus the resulting circuit 10 being truncated such that only power factor correction capacitors 44 and 46 are used—this is illustrated as resulting board 57 being in FIG. 2. In the example of FIG. 2, the user can instead optionally choose to split circuit board 60 at the leftmost break location 45—this will result in resulting board 58 being used to construct circuit 10.

Figure 5A:
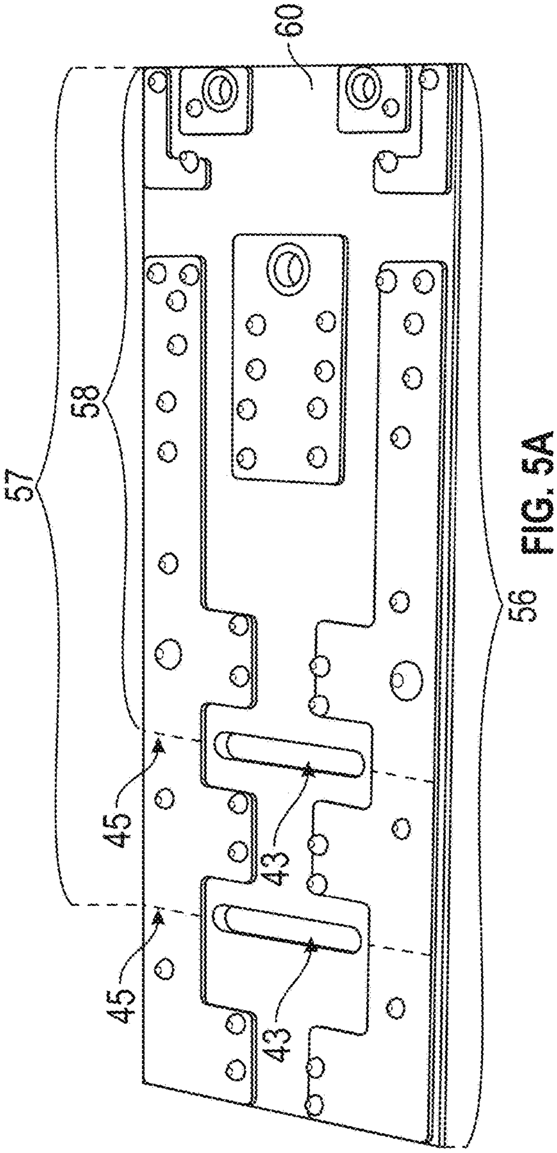
FIG. 5A is a drawing which illustrates a PCB according to an embodiment of the present invention and which comprises two weakened areas so that any of three resulting circuit boards can be created therefrom.

Component connection pads are preferably provided after each power factor correction capacitor to accommodate surge clamp 50 and surge clamp 52, such that when circuit 10 is constructed on the resulting board, surge clamp 50 and surge clamp 52 are preferably disposed in parallel with the final power factor correction capacitor in the circuit, regardless of whether that final power factor correction capacitor is 44, 46, and 48. This can be seen for example by observing surge clamps 50 and 52 after capacitor 48 in FIG. 3 and after power factor correction capacitor 44 in FIG. 5A. Although desirable results can be achieved for any surge clamps that are illustrated as being in parallel with one another when a smaller number of surge clamps are provided, but the effectiveness of the surge clamps are improved when a plurality of them are disposed in parallel with one another. Thus, although the circuit can function and provide desirable results when only one of surge clamps 50 or 52 is provided, more desirable results are achieved by using both surge clamps 50 and 52. This is also the case for surge clamps 38 and 42 and surge clamps 36 and 40. Likewise although one or both of surge clamps 50 and 52 are preferably provided, embodiments of the present invention can still function and can still provide desirable results even if one were to omit both surge clamps 50 and 52 and instead rely entirely on surge clamps 30. However, it is preferred that all three of those surge clamps be provided.

Thermal cutoffs 27 and/or 29 are preferably positioned less than about 10 millimeters ("mm") from surge clamp 30 and more preferably less than about 8 mm and even more preferably less than about 6 mm, and even more preferably less than 4 millimeters and most preferably less than 2 mm, which itself can include directly in contact with surge clamp 30. Optionally, a different surge clamp of circuit 10 can be positioned at these distance ranges with respect to thermal cutoffs 27 and/or 29 instead of or in addition to surge clamp 30. By positioning thermal cutoffs 27 and/or 29 physically close to surge clamp 30, if surge clamp 30 begins to overheat, the heat radiated and/or conducted by it can very quickly trigger thermal cutoff 27 and/or 29, thus cutting power to circuit 10.

Component pads for second and third power factor correction capacitors 46 and 48 are preferably provided on PCB 60. A break location 45 is preferably disposed or otherwise formed or provided in PCB 60 between the connection pads for each of power factor correction capacitors 44, 46, and 48 such that breaking PCB 60 along break location 45 between power factor correction capacitors 46 and 46 will cause the connection locations for power factor correction capacitor 48 to be physically broken away from the remainder of PCB 60. Thus, after constructing circuit 10 on resulting board 57, capacitor 48 will not be provided.

Although the drawings illustrate an embodiment of the present invention wherein two break locations are provided in PCB 60, it is important to understand that this is merely done for illustration and simplicity because PCB 60 can optionally include more or fewer break locations 45 and desirable results will be provided. Thus, PCB 60 can be configured to accommodate more or fewer power factor correction capacitors and is thus not limited to only 3 power factor correction capacitors and only two break locations. In addition, an additional power factor correction capacitor 54 (see FIG. 1) can optionally be added—for example by simply soldering it on. As can be observed, in the embodiment wherein two breakpoints are provided, up to 4 circuit configurations are possible: 1) an unbroken PCB 60 with 4 power factor correction capacitors 44, 46, 48, with additional power factor correction capacitor 54 added, 2) an unbroken PCB 60 without power factor correction capacitor 54, thus containing only three power factor correction capacitors 44, 46 and 48, 3) a circuit with two power factor correction capacitors (44 and 46), wherein PCB 60 has been broken along the rightmost break location 45, to produce resulting board 57 and 4) a circuit with only one power factor correction capacitor (44), wherein PCB 60 has been broken along the leftmost break location 45 to produce resulting board 58.

Although the drawings illustrate an embodiment of the present invention wherein two break locations are provided in PCB 60, it is important to understand that this is merely done for illustration and simplicity because PCB 60 can optionally include more or fewer break locations 45 and desirable results will be provided. Thus, PCB 60 can be configured to accommodate more or fewer power factor correction capacitors and is thus not limited to only 3 power factor correction capacitors and only two break locations. In addition, an additional power factor correction capacitor 54 (see FIG. 1) can optionally be added—for example by simply soldering it on. As can be observed, in the embodiment wherein two breakpoints are provided, up to 4 circuit configurations are possible: 1) an unbroken PCB 60 with 4 power factor correction capacitors 44, 46, 48, with additional power factor correction capacitor 54 added, 2) an unbroken PCB 60 without power factor correction capacitor 54, thus containing only three power factor correction capacitors 44, 46 and 48, 3) a circuit with two power factor correction capacitors (44 and 46), wherein PCB 60 has been broken along the rightmost break location 45, to produce resulting board 57 and 4) a circuit with only one power factor correction capacitor (44), wherein PCB 60 has been broken along the leftmost break location 45 to produce resulting board 58.

In one embodiment, each of the power factor correction capacitors that are installed on PCB 60 can have substantially the same capacitance as one another, or one or more of the power factor correction capacitors can capacitance values that are not the same as all other or any of the other power factor correction capacitors.

Figure 3:
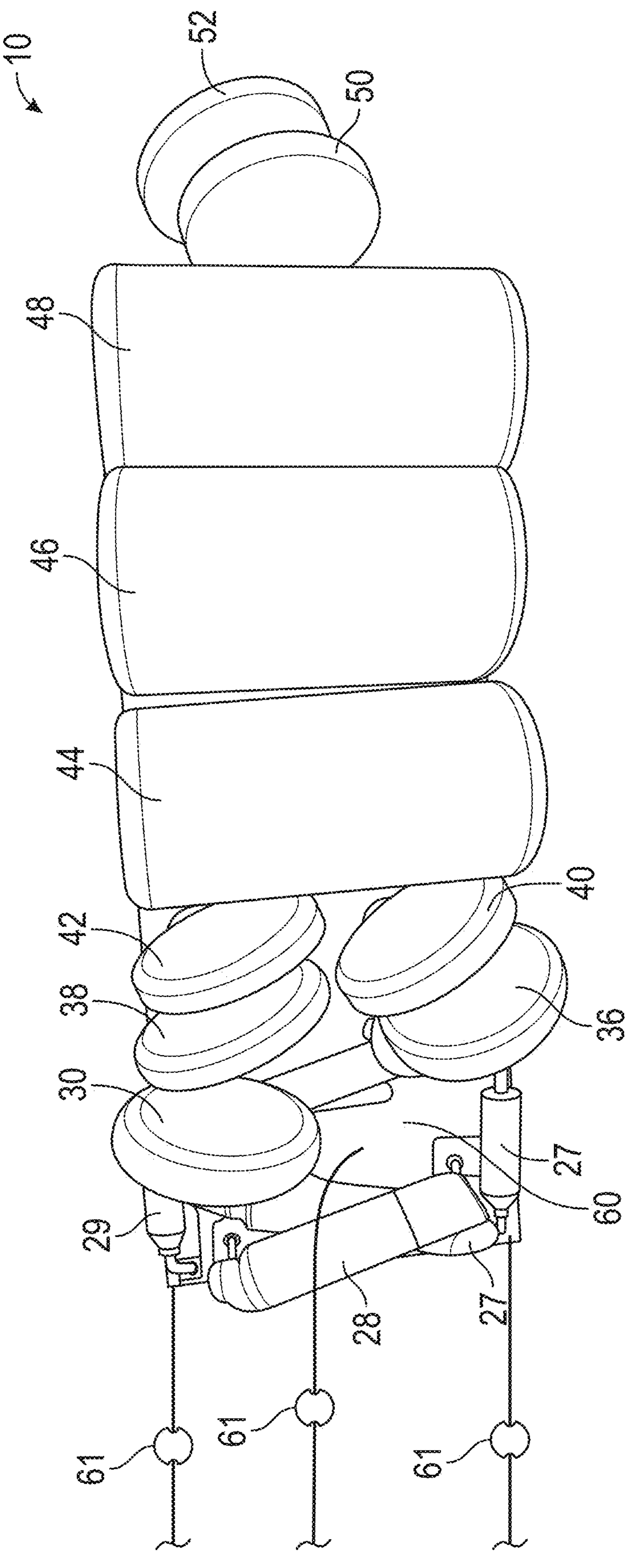
FIG. 3 is a drawing which illustrates an example of a constructed circuit according to FIG. 2 wherein three power factor correction capacitors are provided.
Figure 4:
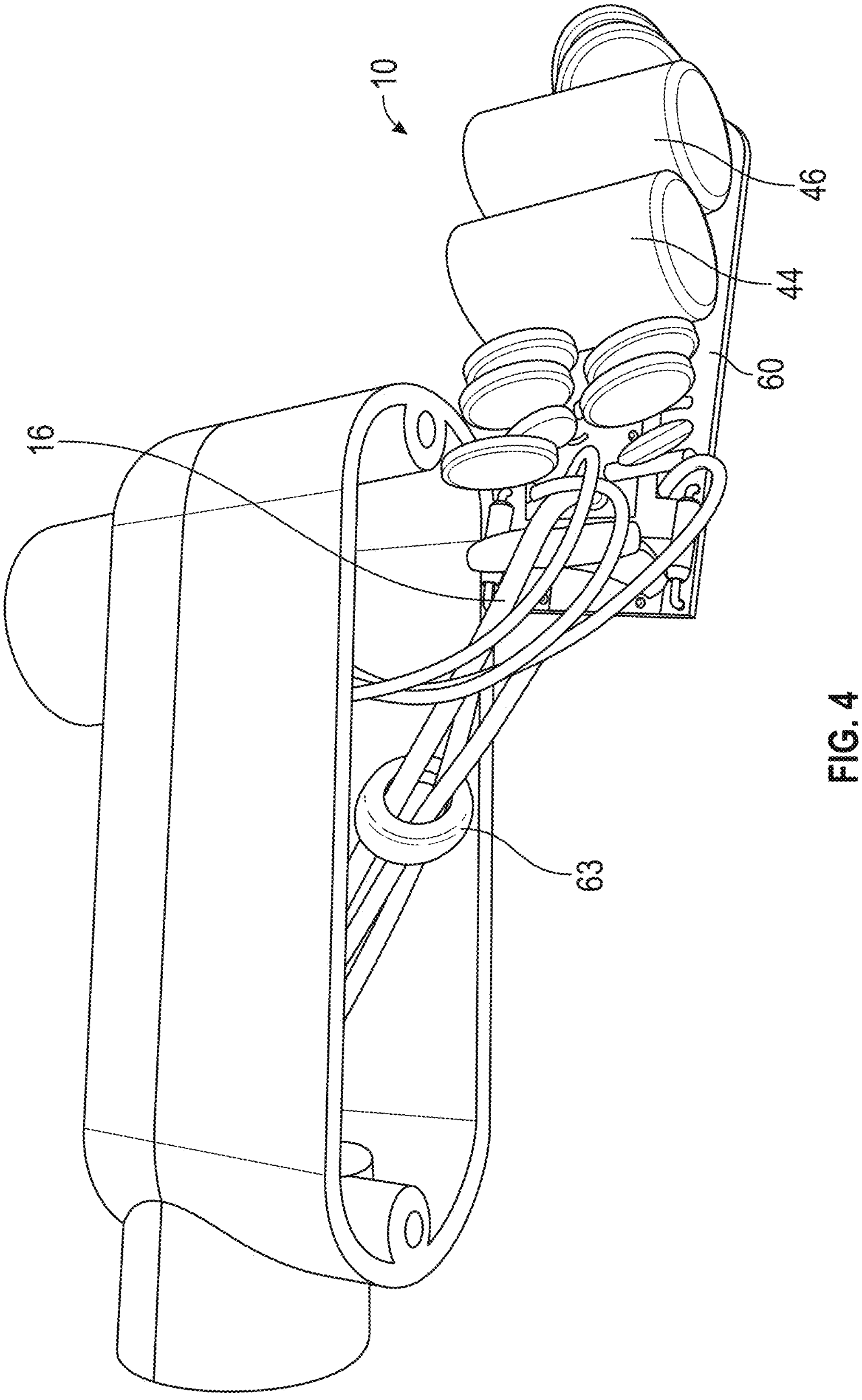
FIG. 4 is a drawing which illustrates an embodiment of the present invention wherein two power factor correction capacitors are provided and wherein a circuit board of the present invention is coupled to wires that can be ran through conduit and wherein the circuit board can be disposed within a housing.
Figure 5B:
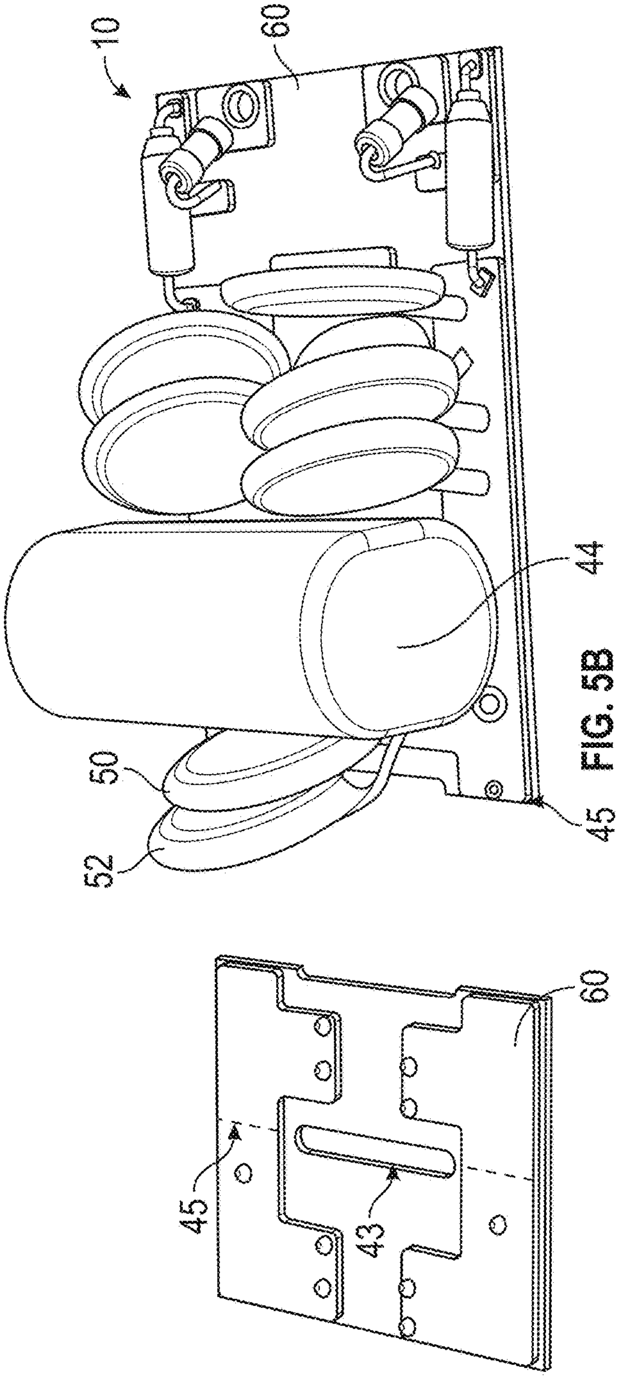
FIG. 5B is a drawing which illustrates the PCB of FIG. 5A which has been broken at a second from the end break location and the circuit has thus been constructed with a single power factor correction capacitor—the remaining unused portion of the circuit board is illustrated as having been separated from the used portion of the circuit board.

FIGS. 3, 4, and 5B drawings of circuits constructed according to an embodiment of the present invention. In FIG. 4, the circuit is removed from a housing. In this embodiment, the two indicator lights are separated from the rest of the circuit and have been mounted on an obverse of the housing, hence the additional connecting wires that span from the circuit to the housing.

Embodiments of the present invention work on the premise of improved power factor performance. Embodiments of the present invention provide reactive energy back into a network or circuit in which it is installed, or provide power factor correction for an inductive load and/or otherwise provide a filtering effect to reduce or remove transients that the load (which need not be an inductive load) would otherwise receive. Thus, in one embodiment, circuit 10 can help bring the network or load closer to unity operation. Many system power sources (usually from utility conglomerates or cooperatives) provide their customers with polluted electricity, that is, other underlying conditions, such as power disturbance occurring from many different sources, (for example wind), weather conditions, customer demand (excessive loading capacity of available electricity from the grid). These present various challenges to the supply availability, in minor cases, surges and spikes occur, thus increasing the customer's likelihood of encountering various harmful effects which shorten the longevity of appliances and equipment associated with the overall electrical supply.

In worse cases, brownouts and blackouts result from too much energy consumption and not enough power supply to compensate the demand. Embodiments of the present invention improve the power factor of the circuit to offset these negative effects. Improved power factor is accomplished by using capacitance added in parallel to the customer's power supply. But the problem with capacitors working by themselves to add power factor correction is the capacitors break down over a relatively short time-usually under three or four years, because the dielectric barrier has been compromised when various anomalies occur. Such anomalies can include, for example, surge and spike voltage, which have a tendency to break through the dielectric structure, within the capacitor.

Embodiments of the present invention add longevity to the power factor device by providing a buffer between the supply and the customer's electrical needs, this is achieved by using various components (for example, thermal cutoffs, fuse protection, capacitors to remove high frequency transients, and/or surge clamps).

Embodiments of the present invention provide surge protection, and energy savings. In one embodiment, components are preferably assembled on a single PCB, which can be used to produce numerous different models and uses off the shelf, including for example various models for three phase voltages of various voltage ratings and for delta vs Y configurations (see FIG. 6). The breakaway PCB configuration helps the invention achieve its flexibility in accommodating so many different configurations. Components like power factor correction capacitors, provide improved power factor for a load and/or system, thus improving efficiency and providing special energy savings. By combining the positive effects of the various components, embodiments of the present invention act as both a surge arrestor, transient suppressor, and a power factor correction device. Because of these characteristics, embodiments of the present invention can aid in not only surge protection, but can also improve energy efficiency, thus reducing the monthly usage for a load or circuit by about 10-35%. In one embodiment, the load that the present invention can be used for can include a home, business, or other establishment or structure.

Embodiments of the present invention can reduce a customer's electrical consumption by up to about 10% to 35%. Embodiments of the present invention can use a potting compound that can include a blended mixture of sand and two-part epoxy that further aids in its insulative properties, thus reducing the heat damage potential that can otherwise occur when other potting materials or no potting materials are used for heat containment. In one embodiment, the sand used is preferably a non-conductive sand. Although the circuit illustrates a split phase configuration, embodiments of the present invention can optionally be provided for 3-phase systems. In one embodiment, the only change that is made for such 3-phase systems can be that an additional power line is provided and components that connect from one of the power lines of FIG. 1 to ground are preferably also provided between the 3rd power line and ground.

Figure 6:
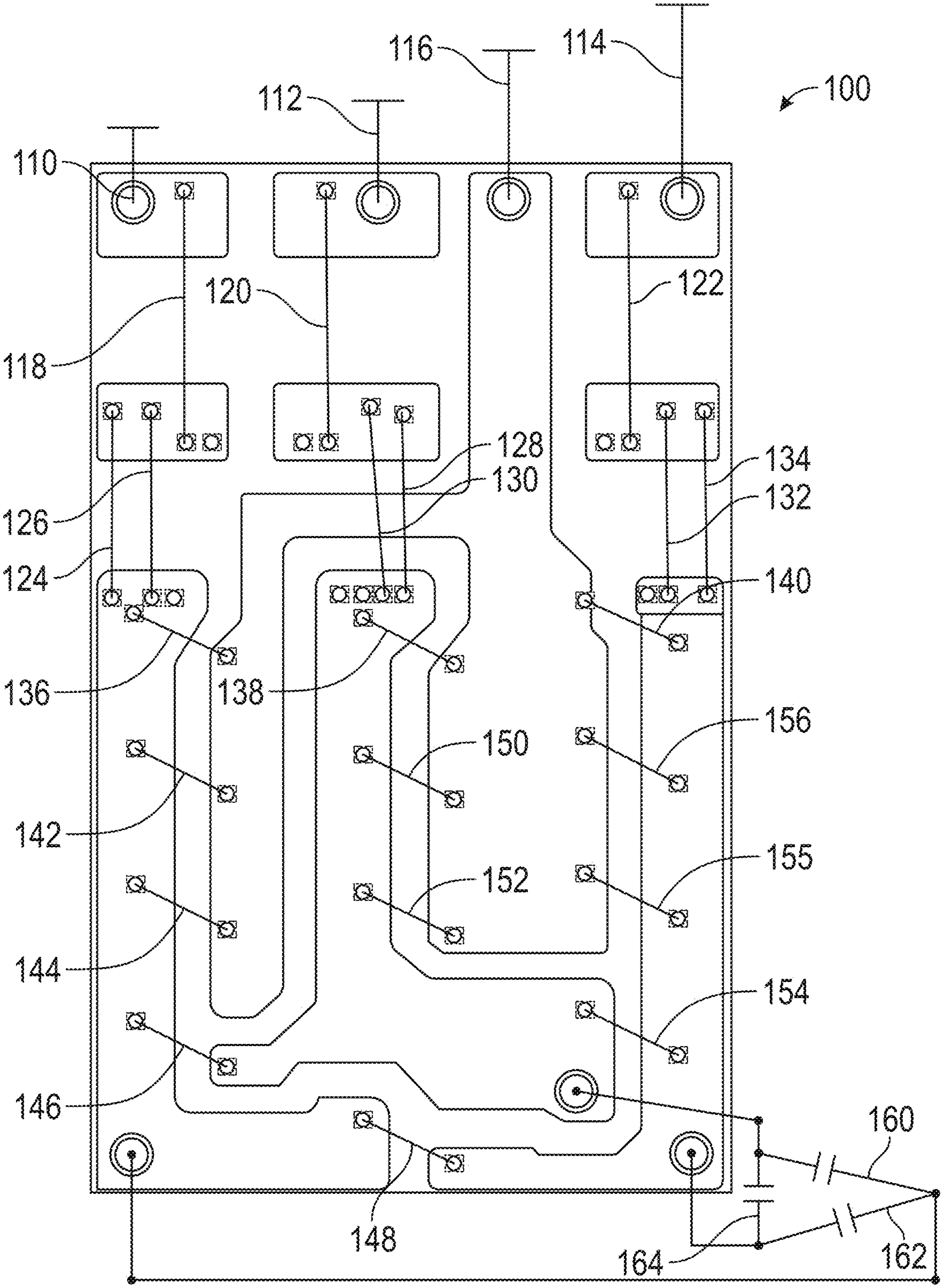
FIG. 6 is a drawing which illustrates an embodiment of the present invention that has been configured for a 3-phase system.

FIG. 6 illustrates a 3-phase system. As can be seen therein, circuit 100 preferably includes first line input 110, second line input 112, third line input 114, and ground input 116, which itself can include a neutral line input. Circuit 100 also preferably includes fuses 118, 120, and 122, which respectively connect to each of first, second, and third line inputs 110, 112, and 114, as well as thermal cutoffs 124, 126, 128, 130, 132 and 134, two of each of which connect to a respective one of fuses 118, 120, and 122. Although FIG. 2 illustrates an embodiment wherein two thermal cutoffs are used on each of the respective three lines, desirable results can be provided when fewer or more thermal cutoffs are used. Each of the first, second, and third lines can be connected to the ground line via one or more surge clamps. For example, as illustrate in FIG. 6, surge clamps 136, 142 and 144 can connect the first line to ground, surge clamps 138, 150 and 152 can connect the second line to ground, and surge clamps 140, 156, and 155 can connect the third line to ground. Each of the first, second, and third lines can also be coupled to one another via a surge clamp-see for example surge clamp 146 which connects first line to second line, surge clamp 148 which connects first line to third line, and surge clamp 154 which connects second line to third line.

Circuit 100 preferably includes power factor correction capacitor 160 which connects from first line to second line, power factor correction capacitor 162 which connects first line to third line, and power factor correction capacitor 164 which connects second line to third line. Optionally instead of directly attaching power factor correction capacitors onto the PCB of circuit 100, one or more sockets can be coupled thereto such that the capacitance values can easily be selectively chosen and the desired capacitance values can simply be plugged in to the socket. This facilitates not only flexibility in allowing a number of circuit boards to be constructed and to then individually have power factor correcting capacitance values inserted that are suitable for a desired application or for a predetermined amount of power factor correction, but also provides the ability for easily replacing one or more of the power factor correction capacitors. The foregoing teachings of similar components for circuit 10 is equally applicable for describing the components used in circuit 100. For example, one or more and most preferably all of the thermal cutoffs of circuit 100 are preferably disposed less than about 10 mm of one or more of the surge clamps of circuit 100, more preferably less than about 8 mm, more preferably still less than about 4 mm and most preferably less than about 2 mm, which can include one or more of the thermal cutoffs being in direct contact with one or more of the surge clamps of circuit 100.

In one embodiment, all of the surge clamps used in the circuit can have the same ratings and values. Alternatively, however, based on the voltage and/or current ratings of a particular application, the values of one or more of the surge clamps can be selected and/or calculated to provide a desirable result. In one embodiment, for a residential unit, the surge clamps preferably have about a 410 volt rating. The ability to use surge clamps of different values makes the circuit of embodiments of the present invention adaptable to a wider range of electrical environments and applications. In one embodiment, the thermal cutoffs used can have a temperature rating of about 132 degrees centigrade and/or of about 172 degrees centigrade can optionally be used.

With circuit 10 installed, when the power usage is observed from a line side, less energy is required from the utility company to perform the same amount of work. In one embodiment, the present invention preferably does not use a microcontroller, microprocessor or other actively controlled switching device or motor controller.

Embodiments of the present invention preferably provide surge suppression with the additional benefits of line conditioning and power factor correction. Real energy savings in real kilowatt usage can be achieved. The circuit of the present invention is preferably installed in parallel with a desired load.

Embodiments of the present invention can provide monthly electrical savings to the end user whether the required application is on residential, commercial, institutional, or industrial locations. Embodiments of the present invention can provide not only power factor correction, but also surge protection, and can reduce the amount of energy consumption from an electrical supplier, thus producing savings.

Embodiments of the present invention can provide protection and the extension of service life to electrical equipment plus real energy savings without the need for a modification that is invasive to electrical, electronic appliance and commercial equipment control systems, without the need to provide active voltage and/or current control. With an apparatus according to an embodiment of the present invention installed at or near the load or where the power is used, there is no need for the user to change the supply that is provided. The power factor correcting capacitors in the apparatus counter or at least assist in countering the inductive loading in the electrical network on which they are installed, thus improving power factor, line loss reduction, current carrying capacity and voltage stability.

Correcting the phase relationship of the voltage and current from the power factor of, for example, 0.75 to unity (1.0) will usually only save about 1% to about 4% in real kilowatt usage and when there is no power factor penalty and with the metering in kilowatts you will get line loss reduction, larger current carrying capacity and greater voltage stability; but, usually no greater than about 4% of actual billed savings.

Embodiments of the present invention preferably follow the guidelines called out in (ANSI/EEE (62.41-1980), which is incorporated herein by reference, and use surge clamps and power factor correcting capacitors to achieve surge and spike protection. surge clamps are preferably used because they have greater energy handling capacity than high speed semiconductors (such as silicon avalanche diodes). They have no follow on current and their response time is more than sufficient for the types of transients encountered in the alternating current ("AC") mains environment.

The ratings for the surge clamps-energy handling capabilities, clamping voltage, nominal operating voltages and component surge life expectancy at +/−10% nominal ratings can be obtained by tables and specification data sheets from manufacturers of surge clamps. Depending on the surge clamp selected an 8/20 microsecond response curve is often cited as the speed of the surge clamp response time. However, they can begin to shunt spike and transient current from the line in as little as 10 nanoseconds. Small transient filtering capacitors can be provided to correct the power factor value to provide a low impedance path to ground for high frequency transients and noise. In one embodiment, such capacitors preferably have a protection rating level of 1.3 kilovolts ("kV"), but other values can optionally be used. By removing transient signals, the longevity of inductive loads and appliances can thus be increased and by removing transient signals the energy associated with them is thus not consumed by the load.

For noise filtering and AC line conditioning, larger filtering capacitors of the correct values are preferably used in conjunction with small filtering capacitors and used for line conditioning to stabilize and smooth electrical swells and surges of longer duration. Embodiments of the present invention can effectively smooth the incongruities of the power voltage/current waveform. As a secondary benefit, the larger capacitors counter inductive loading and can improve power factor to some degree where needed with the benefits associated with it. However, significant improvement in kilowatt reduction has achieved on electrical networks that are scarcely inductive and on networks where the power factor has already been improved to be at or near unity.

Although not specifically addressed, to correct specific harmonic octaves or problems in the industrial environment, the interaction of the surge clamps, small filter capacitors and power factor correction capacitors do attenuate harmonics. Harmonics of the third and fifth octaves are preferably reduced by about 10 decibels ("db") to 20 db. The higher harmonic multiples—for example those at around 2100 Hz are largely shunted to ground along with the higher frequency noise. Total harmonic distortion is reduced significantly. Reduced harmonic distortion and noise and surge suppression with more efficient wave forms results in less heat loss in electrical equipment, especially meters and inductive loads. By enabling the load to cease generating this waste heat, embodiments of the present invention contributes to a savings in overall kilowatts usage per month. Additional benefits include lower currents on the neutral sine wave, resulting in safer operating conditions; better reception on audio-visual equipment and reduction in detrimental effects of noise-based interference and distortions.

In one embodiment, ferrite cores 63 and/or ferrite beads 61, generally referred to herein as a "ferrite" or "ferrites", which are preferably used as clamps, can be used in both single phase and three phase configurations of circuits 10 and 100 (see FIGS. 3 and 4). Ferrites 61 and/or 63 can be disposed on or around one or more of input lines, and/or ground line going into circuits 10 and/or 100. The shape of ferrite does not need to only be a ring or bead as illustrated in FIGS. 3 and 4—for example desirable results can be obtained from a tubular shaped ferrite through which one or more of the lines are ran, or can be a ferrite rod or other shape and one or more of the lines can be wrapped around the ferrite. Optionally, the ferrite can be attached directly onto the board—for example a ring of ferrite can be attached to the board around a pad onto which an input line attaches. Optionally, one or more of the ferrites can be split so that the ferrite can be separated, the one or more lines disposed therein, and the remaining portion of the ferrite attached to encircle or at least substantially encircle the one or more lines. As input power coming through the enclosures will have ferrite clamps which are positioned on each of the hot lines and ground of circuit 10 and/or on the first, second, third and ground lines of circuit 100. The ferrite beads reduce harmonic levels which would otherwise be detrimental to the performance of surge components in circuit 10 and/or 100—for example the surge clamps. Often, expensive equipment can include a variable frequency drive "VFD" which itself can create more interference and harmonic instability to the adjacent or surrounding circuitry and devices. By using these ferrite cores and/or beads, circuits 10 and/or 100 can be installed noticeably closer to the load than before without harming the surge clamps of the circuit, thus making the power factor more efficient and thereby improving overall energy efficiency.

Apparatuses constructed according to embodiments of the present invention can be provided in various sizes of single and three phases. They can be sized according to the capacity of the electrical system kilowatt consumption, percentage and type of electrical equipment. On inductive motor applications, the horsepower rating can be used—as well as associated equipment on the same network.

The terms, "a", "an", "the", and "said" mean "one or more" unless context explicitly dictates otherwise. Note that in the specification and claims, "about", "approximately", and/or "substantially" means within twenty percent (20%) of the amount, value, or condition given.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all references, applications, patents, and publications cited above and/or in the attachments, and of the corresponding application(s), are hereby incorporated by reference. Unless specifically stated as being "essential" above, none of the various components or the interrelationship thereof are essential to the operation of the invention. Rather, desirable results can be achieved by substituting various components and/or reconfiguration of their relationships with one another.

Embodiments of the present invention can include every combination of features that are disclosed herein independently from each other. Although the invention has been described in detail with particular reference to the disclosed embodiments, other embodiments can achieve the same results. Variations and modifications of the present invention will be obvious to those skilled in the art and this application is intended to cover, in the appended claims, all such modifications and equivalents. The entire disclosures of all references, applications, patents, and publications cited above are hereby incorporated by reference. Unless specifically stated as being "essential" above, none of the various components or the interrelationship thereof are essential to the operation of the invention. Rather, desirable results can be achieved by substituting various components and/or reconfiguring their relationships with one another.

What is claimed is:

1. A surge protection and power factor correction apparatus comprising:

an electrical circuit, said electrical circuit comprising:

a ground or neutral line connection;

a first non-grounded line connection;

a second non-grounded line connection;

a third non-grounded line connection;

at least two thermal cutoffs, each of said at least two thermal cutoffs electrically coupled to a respective one of said first and said second non-grounded line connections;

a plurality of surge clamps, at least a first of said plurality of surge clamps coupled between said first non-grounded line connection and said second non-grounded line, a third surge clamp coupled between said second non-grounded line connection and said third non-grounded line connection, a fourth surge clamp coupled between said first non-grounded line connection and said third non-grounded line connection, and a fifth surge clamp coupled between said third non-grounded line connection and said ground or neutral line connection;

a first power factor correction capacitor coupled between said first non-grounded line connection and said second non-grounded line connection; and wherein at least one of said plurality of surge clamps is disposed less than 8 millimeters from each of said at least two thermal cutoffs.

2. The surge protection and power factor correction apparatus of claim 1 wherein at least one of said surge clamps comprises an element selected from a list consisting of a metal oxide varistor, an avalanche diode, a tunnel diode, and a combination thereof.

3. The surge protection and power factor correction apparatus of claim 1 wherein at least one of said plurality of surge clamps is disposed less than 5 millimeters from each of said at least two thermal cutoffs.

4. The surge protection and power factor correction apparatus of claim 1 wherein at least one of said plurality of surge clamps is disposed less than 2 millimeters from each of said at least two thermal cutoffs.

5. The surge protection and power factor correction apparatus of claim 1 wherein at least one of said plurality of surge clamps is positioned in physical contact with each of said at least two thermal cutoffs.

6. The surge protection and power factor correction apparatus of claim 1 wherein said electrical circuit is at least partially encased within a potting material.

7. The surge protection and power factor correction apparatus of claim 6 wherein said potting material comprises sand.

8. The surge protection and power factor correction apparatus of claim 1 further comprising at least two filter capacitors, each of said at least two filter capacitors coupled between a respective one of said first non-grounded line connection and said second non-grounded line connection and said ground or neutral line connection.

9. The surge protection and power factor correction apparatus of claim 1 further comprising a second power factor correction capacitor coupled between said third non-grounded line connection and said first non-grounded line connection and a third power factor correction capacitor coupled between said third non-grounded line connection and said second non-grounded line connection.

* * * * *